United States Patent [19]
Barral et al.

[11] Patent Number: 5,983,800
[45] Date of Patent: *Nov. 16, 1999

[54] MACHINE FOR INSULATING AND COOLING PHOTOPOLYMER PLATES FOR FLEXOGRAPHIC PRINTING

[75] Inventors: Christian Barral, Uffholtz, France; Flaviano Crespi, Villa Cortese; Giorgio Cattani, Piacenza, both of Italy; Michel Schanen, Guewenheim, France

[73] Assignee: Rollin S.A., France

[*] Notice: This patent issued on a continued prosecution application filed under 37 CFR 1.53(d), and is subject to the twenty year patent term provisions of 35 U.S.C. 154(a)(2).

[21] Appl. No.: 08/951,575

[22] Filed: Oct. 16, 1997

[30] Foreign Application Priority Data

Oct. 16, 1996 [FR] France .................... 96 12635

[51] Int. Cl.⁶ .................................. G03B 27/26
[52] U.S. Cl. .................... 101/401.1; 355/30; 355/113; 34/278
[58] Field of Search .............. 101/401.1, 424.1, 101/487; 355/30, 99, 113; 34/266, 269, 278, 275

[56] References Cited

U.S. PATENT DOCUMENTS

| | | |
|---|---|---|
| 3,604,798 | 9/1971 | Gerson .................... 355/30 |
| 4,143,278 | 3/1979 | Koch, II .................... 34/4 |
| 4,147,429 | 4/1979 | Lysle .................... 355/113 |
| 4,434,562 | 3/1984 | Bubley et al. .................... 34/4 |
| 4,786,947 | 11/1988 | Kosugi et al. .................... 355/30 |
| 4,885,604 | 12/1989 | Adachi et al. .................... 355/30 |
| 5,222,309 | 6/1993 | Ross .................... 34/155 |
| 5,343,629 | 9/1994 | Rae .................... 34/278 |
| 5,877,843 | 3/1999 | Takagi et al. .................... 355/53 |

FOREIGN PATENT DOCUMENTS

| | | |
|---|---|---|
| 0 480 073 | 4/1992 | European Pat. Off. . |
| 2 522 532 | 9/1983 | France . |
| 38 29 555 | 12/1989 | Germany . |
| 90 03 438 U | 5/1990 | Germany . |

OTHER PUBLICATIONS

Patent Abstracts of Japan, vol. 014, No. 104 (P–1013), Feb. 26, 1990 & JP 01 307758 A (Toshiba Corp), Dec. 12, 1989.

Primary Examiner—Stephen R. Funk
Attorney, Agent, or Firm—Woodcock Washburn Kurtz Mackiewicz & Norris LLP

[57] ABSTRACT

An improved machine for insolating photopolymer plates and comprising a device secured sidewise onto the frame and delivering a flow of cooling air tangentially to the top part of the frame of the machine to avoid the formation of defects on the photosensitive polymer plate disposed upon the top part of the frame, in view of the energy radiated by the ultraviolet source insolating the plate, the machine permitting the insolation of photopolymer plates for flexographic printing.

2 Claims, 1 Drawing Sheet

MACHINE FOR INSULATING AND COOLING PHOTOPOLYMER PLATES FOR FLEXOGRAPHIC PRINTING

BACKGROUND OF THE INVENTION

The present invention relates essentially to an improved machine for insolating photopolymer plates for flexographic printing.

There has already been proposed machines suitable for carrying out the insolation of photopolymer plates with the assistance of a source of ultraviolet light.

In a general manner these machines comprise a frame above which is arranged at least one bank or row of ultraviolet lamps.

Upon the upper part of the frame underneath the bank of ultraviolet lamps one places a photopolymer plate which is insolated by the lamps through a negative film placed on the plate. The film-plate assembly is held under vacuum on the upper portion of the frame of the machine with the assistance of a transparent membrane.

It has now been found that the energy of the ultraviolet lamps heats the space defined by the transparent membrane and the upper portion of the frame of the machine, i.e. the space containing the negative film and the flexographic plate.

It results therefrom that in spite of the vacuum provided in that space, the latter forms a gas pocket which results in the separation or disconnection of the flexographic plate from the negative film.

One therefore is subjected to bad insolation conditions so that one eventually obtains a printing plate which is fuzzy.

More specifically after the insolation of the plate under the bad conditions stated hereinabove and after washing of this insolated plate with a solvent, it appears that there is a bad definition or resolution of the relief of the plate produced by the ultraviolet light which either travels through the transparent zones of the negative film or is stopped by the opaque zones of this film, so that the printing provided by this plate after inking thereof will be fuzzy.

Therefore the object of the present invention is to remedy these inconveniences by providing an improved machine owing to which the flexographic plate to be insolated will not undergo any disturbance or trouble due to the heat of the ultraviolet light lamps.

SUMMARY OF THE INVENTION

For that purpose, the subject of the invention is an improved machine for insolating photopolymer plates for flexographic printing of the type comprising a frame above which is located at least one source of ultraviolet light capable of insolating a photopolymer plate resting upon said frame through a negative film, the film and plate generally being overlaid with a transparent membrane and held thereby, under vacuum, on the frame. The improvement of the invention comprises means for cooling the upper portion of the frame in the vicinity of the membrane, the negative film, and the photopolymer plate.

According to one exemplary embodiment of this machine, the cooling means is a fan or blower or the like fastened sidewise to the frame and supplying a flow of cooling air tangential to the upper portion of the frame and to the aforesaid system.

According to another embodiment, the cooling means is a fan or blower or the like arranged above the source of ultraviolet light and delivering a flow of cooling air orthogonal to the upper portion of the frame and to the aforesaid system. In this latter case, the fan or blower may be arranged above one bank of fans for cooling the source of ultraviolet light itself disposed below the bank. Such a bank of fans has been present in prior art machines, but has not been effective to cool the area under the hood well below the lights, in the lower region when the photopolymer plate is resting.

Thus the simultaneous cooling of the ultraviolet lamps and of the flexographic plate together with its associated elements will be advantageously provided.

The invention will be better understood and further objects, characterizing features, details and advantages thereof will appear more clearly as the following explanatory description proceeds with reference to the accompanying diagrammatic drawings given by way of non limiting examples only illustrating two presently preferred specific embodiments of the invention and in which:

DESCRIPTION OF THE INVENTION

Figure 1:
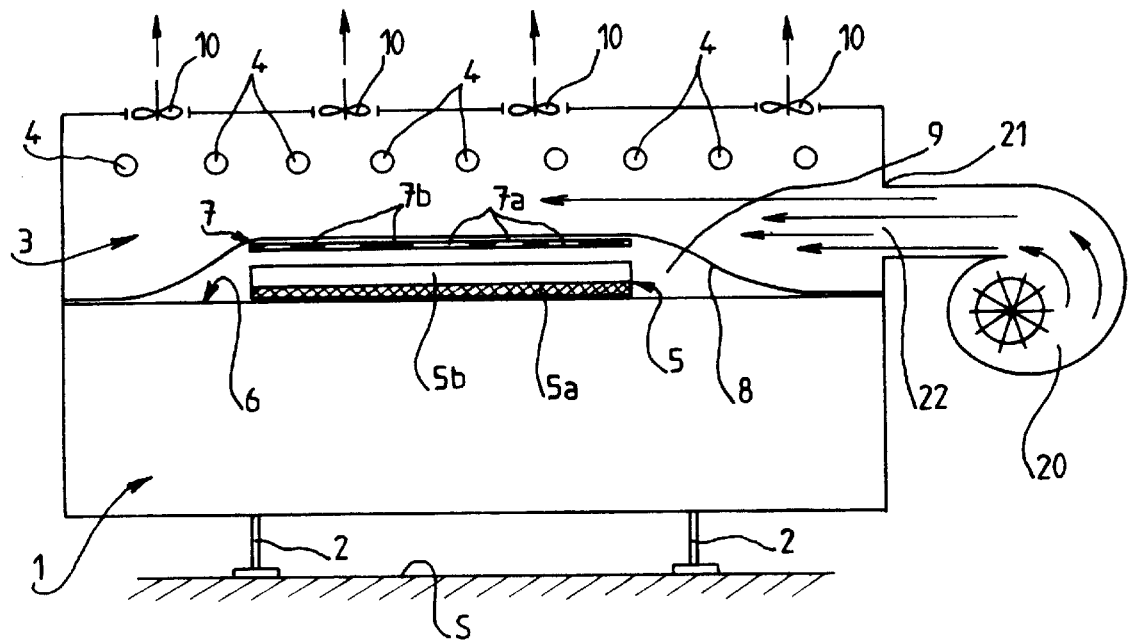
FIG. 1 is a diagrammatic elevational view of a machine according to the principles of the invention.
Figure 2:
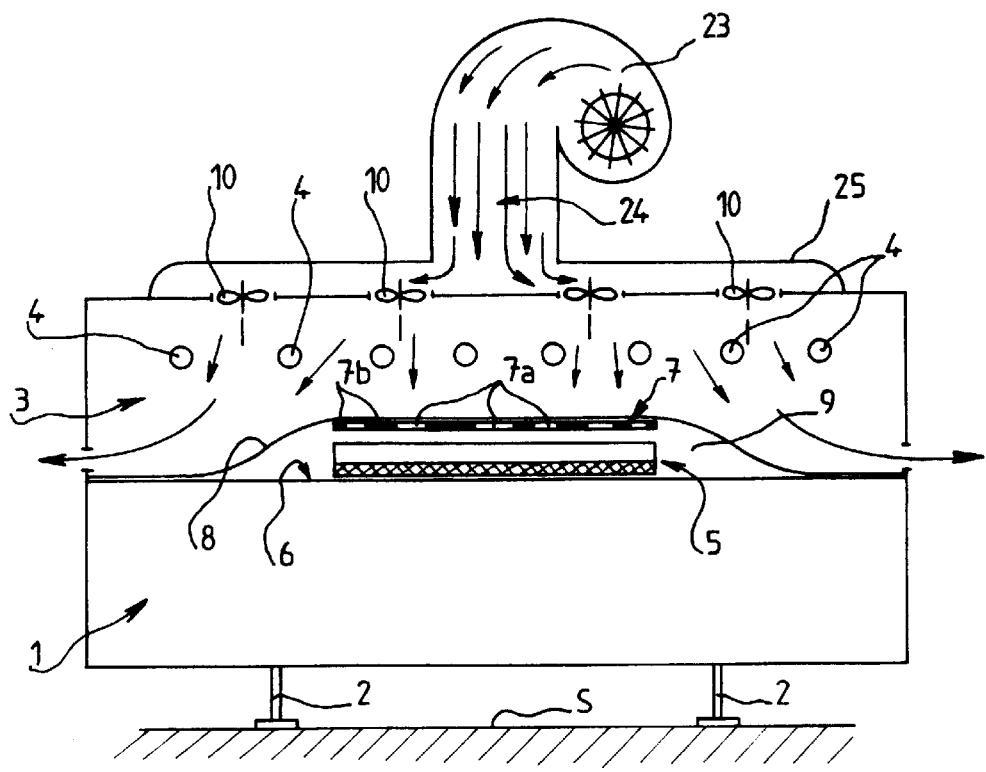
FIG. 2 is a another diagrammatic elevational view but showing another embodiment of this machine.

On FIGS. 1 and 2 is seen that a machine for insolating photopolymer plates essentially comprises a frame 1 resting through the medium of feet 2 upon the ground S, which frame comprises and is topped by a hood-like element or the like 3 containing a source of ultraviolet light forming a bank or row of lamps designated at 4 according to the example shown.

The bank 4 permits the insolation with ultraviolet light of a plate made from a photopolymer material placed underneath the hood 3 upon the top portion 6 of the frame 1 of the machine. The plate 5 generally consists of a base 5a made from polyester and of a layer 5b of photosensitive polymer.

On the plate 5 is disposed a negative film 7 comprising transparent zones 7a and opaque zones 7b through which will therefore travel or not travel the ultraviolet light emitted by the bank of lamps 4 for insolating or not insolating the layer 5b of photosensitive polymer which after having been washed with a solvent and dried will comprise the reliefs desired for printing.

The system of negative film 7 and flexographic plate 5 will be held under vacuum upon the top portion 6 of the frame 1 owing to a transparent membrane 8 defining a space 9 between it and the top portion 6 of the frame 1.

At 10 on the Figures has been shown a bank of fans or blowers carried by the hood 3 of the frame 1 which fans, in the prior art, provided some cooling of the bank of ultraviolet lamps 4.

All the arrangements referred to hereinabove form part of the known state of prior art and do not require any additional explanations.

According to the invention, the machine which has just been described is fitted with at least one device for cooling the upper portion 6 of the frame 1 at the level of the system consisting of the membrane 8, the negative film 7 and the plate 5 of photopolymer material.

This device may be of any conventional cooling type, which may but need not include air-conditioning or precooled pulsating air, and will advantageously avoid the formation of a gas pocket within the space 9 between the membrane 8 and the top part 6 of the frame 1 in view of the heat generated by the bank of ultraviolet lamps 4, it being understood that the bank of small fans 10 is ineffective to avoid the formation of such gas pockets.

According to the exemplary embodiment shown on FIG. 1, the cooling device is a fan or blower 20 which is secured sidewise onto the frame 1 and more specifically below the hood 3 forming part of the frame and topping it as seen at 21.

Thus the fan or blower 20 will be adapted to deliver a flow 22 of cooling air substantially tangential to the upper part 6 of the frame and therefore to the system consisting of the membrane 8, the negative film 7 and the plate of photosensitive polymer 5.

According to another embodiment as seen in FIG. 2, the cooling device is a fan or blower 23 that has been disposed above the bank 4 of ultraviolet light so as to supply a flow 24 of cooling air substantially orthogonal to the upper part 6 of the frame 1, therefore supplying the cooling air to the system of the membrane 8, the negative film 7, and the plate of photopolymer 5 resting upon the said upper part.

More specifically the fan 23 is at its outlet provided with a skirt or the like 25 which is fastened onto the hood 3 of the frame 1 above the bank of fans 2 for cooling the ultraviolet lamps 4.

Thus owing to such an arrangement, the bank of lamps 4 as well as the system consisting of the membrane 8, of the film 7, of the photosensitive polymer plate 5 resting upon the top part 6 of the frame 1 will be effectively and simultaneously cooled.

The invention therefore provides a machine for insolating photopolymer plates which avoids any adverse affects to the relief images on the photosensitive polymer plate 5 that might otherwise be caused by the energy radiated by the ultraviolet lamps insolating the plate.

The invention is not limited to the embodiments described and illustrated which have been given by way of examples only.

Thus the lamps of ultraviolet light may be arranged in any manner whatsoever and provided in any number and likewise the cooling device fitting the machine may be of any type whatsoever.

This means that the invention comprises all the technical equivalents of the means described as well as their combinations if the latter fall within the scope of the appended claims.

We claim:

1. Improved machine for insolating photopolymer plates for flexographic printing of the type comprising a frame having a top portion above which is located at least one source of ultraviolet light capable of insolating a photopolymer plate resting upon the top portion of the frame through a negative film, the film and the plate being overlaid with a transparent membrane and held thereby on the frame, the improvement comprising a cooling device positioned at the level of the membrane, the negative film and the plate for delivering a flow of cooling air tangential to the top portion of the frame and the membrane.

2. The machine of claim 1 wherein said cooling device comprises at least one fan fastened onto the side of said frame.

* * * * *